United States Patent
Fuchs

(10) Patent No.: US 10,008,847 B2
(45) Date of Patent: Jun. 26, 2018

(54) CIRCUIT ARRANGEMENT FOR THE THERMAL PROTECTION OF A POWER SEMICONDUCTOR

(71) Applicant: HKR SEUFFER AUTOMOTIVE GMBH & CO. KG, Kupferzell (DE)

(72) Inventor: Jochen Fuchs, Waldenburg (DE)

(73) Assignee: HKR SEUFFER AUTOMOTIVE GMBH & CO. KG, Kupferzell (DE)

(*) Notice: Subject to any disclaimer, the term of this patent is extended or adjusted under 35 U.S.C. 154(b) by 368 days.

(21) Appl. No.: 14/703,010

(22) Filed: May 4, 2015

(65) Prior Publication Data
US 2015/0349516 A1 Dec. 3, 2015

(30) Foreign Application Priority Data
May 27, 2014 (DE) .................. 10 2014 008 021

(51) Int. Cl.
*H02H 5/04* (2006.01)
*H01L 23/34* (2006.01)
(Continued)

(52) U.S. Cl.
CPC ............. *H02H 5/042* (2013.01); *H01L 23/34* (2013.01); *H01L 23/36* (2013.01);
(Continued)

(58) Field of Classification Search
CPC .................. H02H 5/042; H01L 23/34
See application file for complete search history.

(56) References Cited

U.S. PATENT DOCUMENTS 6,331,763 B1 * 12/2001 Thomas ................ H02H 9/042
320/136
6,518,731 B2 * 2/2003 Thomas ................ H02H 9/042
320/135
(Continued)

FOREIGN PATENT DOCUMENTS

DE          10103919 A1   8/2002
DE       102009034825 A1   2/2011
(Continued)

*Primary Examiner* — Scott Bauer
(74) *Attorney, Agent, or Firm* — Ware, Fressola, Maguire & Barber LLP

(57) ABSTRACT

The present invention concerns a circuit arrangement for thermal protection of a power semiconductor, wherein there is provided a two-stage thermal protection in the control circuit and in the load circuit of the power semiconductor. A first stage (10) with temperature-dependent resistance device serves for reducing or switching off the control voltage of the power semiconductor (30) when a first threshold temperature is reached at the temperature-dependent resistance device. In addition, provided in the load circuit of the power semiconductor (30) is a second stage (20) with a cutout element thermally coupled to the power semiconductor (30) for interrupting a load current of the power semiconductor when a second threshold temperature is reached at the cutout element. In that case the first stage forms an active temperature protection for the power semiconductor (30) to avoid damage and the second stage forms a temperature protection in the case of a malfunction of the power semiconductor (30).

15 Claims, 4 Drawing Sheets

(51) Int. Cl.
  *H01L 23/367* (2006.01)
  *H01L 23/433* (2006.01)
  *H01L 23/40* (2006.01)
  *H01L 23/36* (2006.01)
  *H01L 23/04* (2006.01)
  *H01L 23/498* (2006.01)

(52) U.S. Cl.
  CPC .......... *H01L 23/3675* (2013.01); *H01L 23/40* (2013.01); *H01L 23/4093* (2013.01); *H01L 23/433* (2013.01); *H01L 23/4338* (2013.01); *H01L 23/04* (2013.01); *H01L 23/49811* (2013.01); *H01L 2924/0002* (2013.01)

(56) References Cited

U.S. PATENT DOCUMENTS

| | | | | |
|---|---|---|---|---|
| 6,608,470 | B1 * | 8/2003 | Oglesbee | H01M 2/348 320/135 |
| 7,660,096 | B2 * | 2/2010 | Golubovic | H01C 7/102 361/103 |
| 8,363,420 | B2 * | 1/2013 | Tominaga | H05K 3/32 361/715 |
| 2004/0165325 | A1 * | 8/2004 | Horng | H02H 7/0852 361/25 |
| 2006/0268645 | A1 * | 11/2006 | Graf | H01H 37/761 365/225.7 |
| 2007/0210893 | A1 * | 9/2007 | Hasunuma | H01M 2/34 338/25 |
| 2008/0062603 | A1 * | 3/2008 | Richter | H02H 3/025 361/93.1 |
| 2008/0246441 | A1 * | 10/2008 | Tsubaki | H02H 7/18 320/150 |

FOREIGN PATENT DOCUMENTS

| | | |
|---|---|---|
| DE | 102009037259 A1 | 2/2011 |
| DE | 102013100347 A1 | 8/2013 |

* cited by examiner

CIRCUIT ARRANGEMENT FOR THE THERMAL PROTECTION OF A POWER SEMICONDUCTOR

CROSS-REFERENCE TO RELATED APPLICATION

This application claims priority under 35 USC § 119 to German Patent Application No. 102014008021.8 filed on May 27, 2014, which application is hereby incorporated by reference in its entirety.

TECHNICAL FIELD

The present invention concerns a circuit arrangement for the thermal protection of a power semiconductor, which can serve for example for actuating an electric motor for numerous applications.

BACKGROUND OF THE INVENTION

The demand for electronics which can be used in challenging environments like for example under the engine hood or in rugged industrial applications is steadily rising. As a result the need for new materials and more efficient power components is also growing. High-power applications involving high temperatures can lead to potentially serious heat problems if components like power transistors (for example metal oxide semiconductor field effect transistors (MOSFETs)), capacitors, resistors or integrated circuits are exposed to such rugged conditions for a long time.

Design technologies for improving heat distribution and integration of new cooling element materials have been proposed to improve thermal management. In addition secondary protective measures have been proposed to stop thermal instability which was caused by the failure of power components or by corrosion-induced heating.

Frequently the use of thermal cutouts or a thermal circuit breaker or a thermoswitch is proposed. Such components afford extensive and specific temperature activation features both in alternating current and also in direct current applications. However they place high demands on the circuit board mounting. As exclusively components for surface mounting are used in relation to more and more circuit boards a component with a through-hole can entail special mounting methods and additional costs and complexity.

In the harsh environment of motor vehicles power semiconductors like for example power MOSFETs are regularly exposed to extreme temperature fluctuations and an extreme thermomechanical stress. Intermittent short-circuits, cold operational environments, arcs and inductive loads and multiple short-circuits can lead to fatigue phenomena on the component in the passage of time so that the component fails in the open, short-circuited or resistive mode.

Although power semiconductors like MOSFETs are becoming increasingly more robust, they are susceptible to failures which can occur very quickly if their nominal values are exceeded. Thus for example when the maximum operating voltage is exceeded an avalanche breakdown occurs. If the energy liberated is above the nominal avalanche energy the components can suffer damage and fail. Power semiconductors in the motor vehicle field are demonstrably more susceptible to fatigue and failure than components which are installed in less demanding situations of use. After five years of use the difference in the failure rates can be greater than a factor of ten. Although such a component can withstand initial tests it has been proved that under certain conditions weak points randomly distributed therein can cause a failure during use.

Even in situations in which MOSFETs operate within the specified operating conditions randomly distributed and unpredictable resistive short-circuits are observed, with different resistance values. The failure in the resistive mode is particularly disturbing, not only for the MOSFETs but also for the circuit boards. A figure of 10 W can already cause a local hotspot of more than +180° C., which is markedly above the typical temperature limit of +135° C. for a circuit board. The epoxy structure thereof is damaged as a result and a thermal event occurs.

Cooling fan modules (CFMs) are essential elements in air conditioning installations and engine cooling systems of vehicles. They cool the engine down and prevent potential overheating under certain conditions, for example in hot weather and when negotiating steep gradients. CFMs are generally integrated under the engine hood and are exposed to more extreme temperature fluctuations, in comparison with modules in the passenger cabin. That thermal loading can accelerate fatigue of the power MOSFET and can lead to premature failure.

There is therefore a need for improved thermal protection of power semiconductors.

SUMMARY OF THE INVENTION

Therefore the object of the present invention is to provide a circuit arrangement with improved technical protection for at least one power semiconductor.

That object is attained by a circuit arrangement as set forth in claim 1.

By the provision of the first stage with a temperature-dependent resistance device for reducing the control voltage of the power semiconductor when a first threshold temperature is reached and the second stage with thermally coupled cutout element for interrupting the load current of the power semiconductor when a second threshold temperature is reached, it is possible to achieve improved two-pronged protection in the control circuit and in the load circuit of the power semiconductor. When the first threshold temperature is reached the control voltage of the power semiconductor is adjusted down until the temperature falls below the first threshold temperature. When the critical second threshold temperature is exceeded the load current of the power semiconductor is interrupted by the cutout element, which leads to a hard current shut-down before the circuit board can be damaged by a hot spot.

Preferably the circuit arrangement can have a circuit board adapted to be received in a closed housing with integrated cooling body and passed-out connecting contacts. That compact structure in the closed housing permits good protection from influences in a harsh operating environment like for example a motor vehicle.

Preferably there can be provided a spring device for pressing the power semiconductor and/or the board against the cooling body. That leads to a reduction in the thermal resistance between cooling body and power semiconductor or board so that the heat can be more easily dissipated.

In a preferred embodiment the cooling body can be connected to the housing by way of a releasable latch connection. That permits easy opening of the closed housing or replacement of the cooling body for adapting the circuit arrangement to altered ambient conditions.

Preferably the temperature-dependent resistance device can be arranged in a voltage divider branch of the first stage.

In that way the effect of a change in resistance of the temperature-dependent resistance device on the control voltage of the power semiconductor can be adjusted by suitable dimensioning of the voltage divider.

The temperature-dependent resistance device can preferably have a resistor with a positive temperature coefficient. Such a resistor can also be implemented by a semiconductor component provided for example in the first stage or a semiconductor circuit with a corresponding characteristic. Thus it is possible to achieve a desired change in the control voltage of the power semiconductor by a suitable choice of the temperature coefficient.

Preferably the thermal cutout element has at least one melting fuse. That permits simple replacement of the thermal cutout element after a tripping event.

Finally the power semiconductor can be a field effect transistor for controlling an electric motor. That permits improved thermal protection in the actuation of electric motors of all kinds.

BRIEF DESCRIPTION OF THE DRAWINGS

The invention is described in greater detail hereinafter by means of embodiments by way of example with reference to the drawing in which.

DETAILED DESCRIPTION

Set out hereinafter is a description of various embodiments by way of example of the present invention with reference to a circuit arrangement for actuating an electric motor for a fan blower or the like in a motor vehicle.

Figure 1:
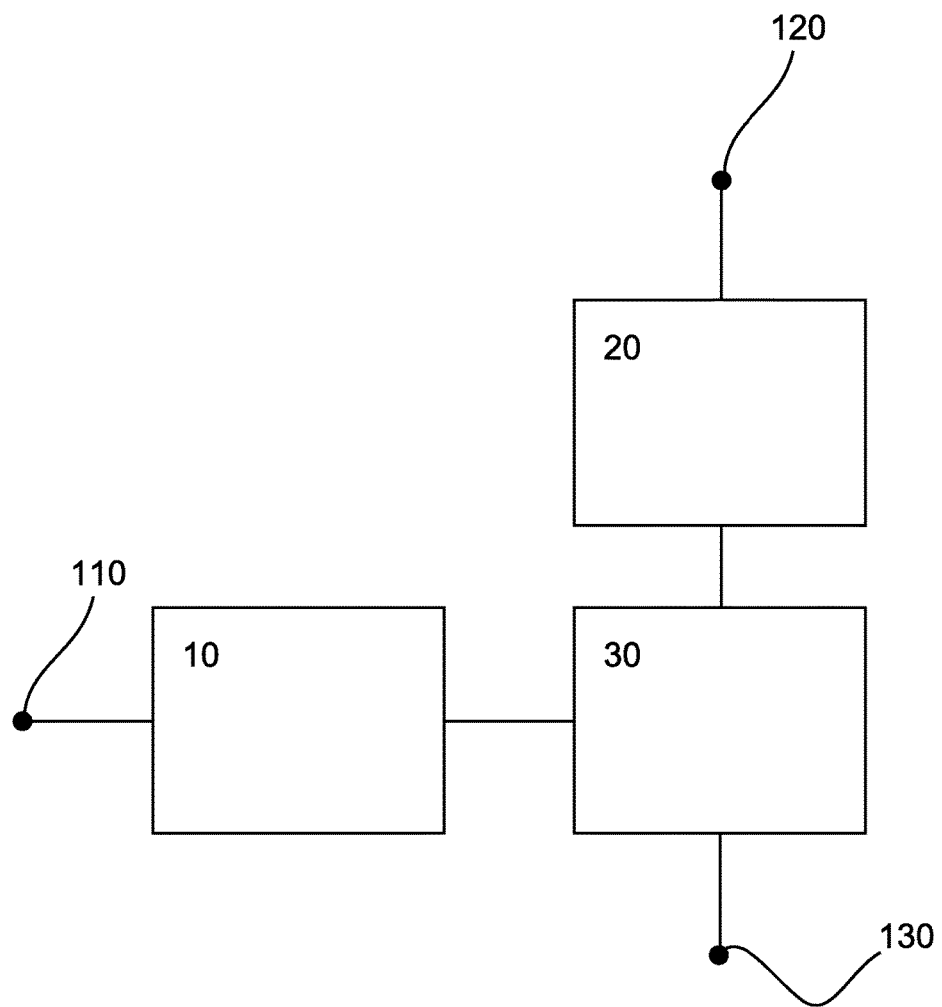
FIG. 1 shows a schematic block circuit diagram of a circuit arrangement according to a first embodiment of the present invention.

FIG. 1 shows a schematic block circuit diagram of a circuit arrangement according to a first embodiment, wherein a power semiconductor or a power switching module 30 comprising at least one power semiconductor is protected from thermal overload by a two-stage thermal protection device.

The two-stage thermal protection measure comprises a first stage 10 in the control circuit of the power semiconductor 30 and serves for reducing or switching off a control signal (control voltage or control current) applied at a control input 110 when a first predetermined temperature (for example switch-off temperature) is reached or exceeded so that a reversible regulated switch-off can be achieved at the control terminal of the power semiconductor 30. In that way the power semiconductor can be protected from an incorrect loading or inadequate ventilation.

Serving as the second stage 20 for thermal protection of the power semiconductor 30 is a thermal cutout device which is connected in series in the load circuit of the power semiconductor 130 between an operating voltage potential 120 and a reference potential 130 (for example ground potential). That second stage leads to an interruption in the load circuit in the event of a critical temperature being reached or exceeded so that a thermally unstable event at the power semiconductor 30 leads to a breakdown of the thermal cutout device of the second stage 20 before a hot spot can be formed. The power semiconductor 30 is thus protected from a breakdown in its load path between its two load terminals in the case of an over-voltage, a short-circuit, a jammed motor or overheating.

The first stage 10 can be a temperature-dependent resistance device which can involve a PTC (positive temperature coefficient) resistor, an NTC (negative temperature coefficient) resistor, a semiconductor component or a semiconductor circuit with a corresponding characteristic. The thermal cutout device of the second stage 20 can be implemented by a melting fuse or a corresponding semiconductor cutout element with temperature-dependent interruption.

Figure 2:
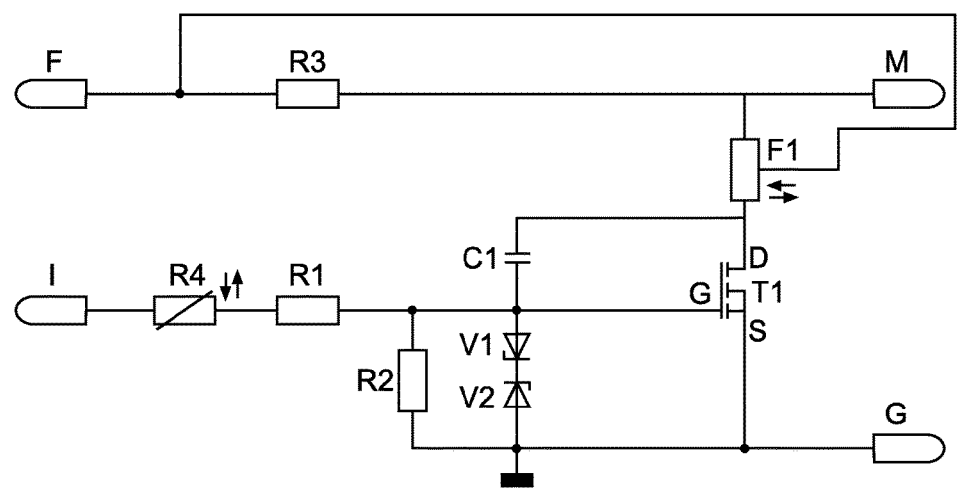
FIG. 2 shows a schematic block circuit diagram of a circuit arrangement according to a second embodiment of the present invention.

FIG. 2 shows a diagrammatic circuit plan of a detailed circuit arrangement according to a second embodiment.

In the circuit shown in FIG. 2 the power semiconductor is a self-locking n-channel MOSFET transistor T1, in the load circuit of which a melting fuse F1 is connected in serial relationship and which is connected to a motor terminal M by way of that melting fuse F1. In this arrangement the melting fuse F1 is connected to the drain terminal D of the MOSFET transistor T1. The source terminal S of the MOSFET transistor T1 is connected to ground potential. The electric motor (not shown in FIG. 2) controlled by the MOSFET transistor T1 is connected between the terminals M and a terminal G connected to ground potential.

The MOSFET transistor T1 can also be coupled dynamically in feed-back relationship by way of a capacitor C1 and can be protected from over-voltages by anti-serially connected Z-diodes or Zener diodes V1 and V2, at the gate terminal G thereof. A control input I of the circuit arrangement for controlling the electric motor is connected to the gate terminal G of the MOSFET transistor T1 by way of a PTC resistor R4 and a voltage divider formed from resistors R1 and R2. The ratio of the input signal to the control signal at the gate terminal G of the MOSFET transistor T1 can be influenced by a suitable choice of the two resistors R1 and R2 of the voltage divider. With increasing temperature the resistance of the PTC resistor R4 rises and the control voltage which is divided down by the voltage divider at the gate terminal G of the MOSFET transistor T1 is correspondingly reduced. This can provide that the forward resistance of the MOSFET transistor T1 in the load circuit increases and the control voltage of the MOSFET transistor T1 becomes so low when a predetermined temperature is reached that the MOSFET transistor T1 finally interrupts the load circuit. That corresponds to the protective action of the first stage 10 in FIG. 1.

The melting fuse F1 in the load circuit of the MOSFET transistor T1 corresponds to the second stage 20 in FIG. 1 and leads to an interruption in the load circuit when a further (higher) predetermined temperature is reached in order thereby to protect the MOSFET transistor T1 from a breakdown in its drain-source path in the event of over-voltages, short-circuits, excessive loading or overheating.

In addition by way of optional feedback terminal F a feedback signal is provided by way of a resistor R3 from the motor terminal M or a control terminal of the melting fuse F1.

It is pointed out that the schematic circuit diagram of FIG. 2 only shows the components required to describe the mode of operation of the present invention. Further components for optimizing the function of motor actuation are not shown for reasons of simplicity.

Figure 3:
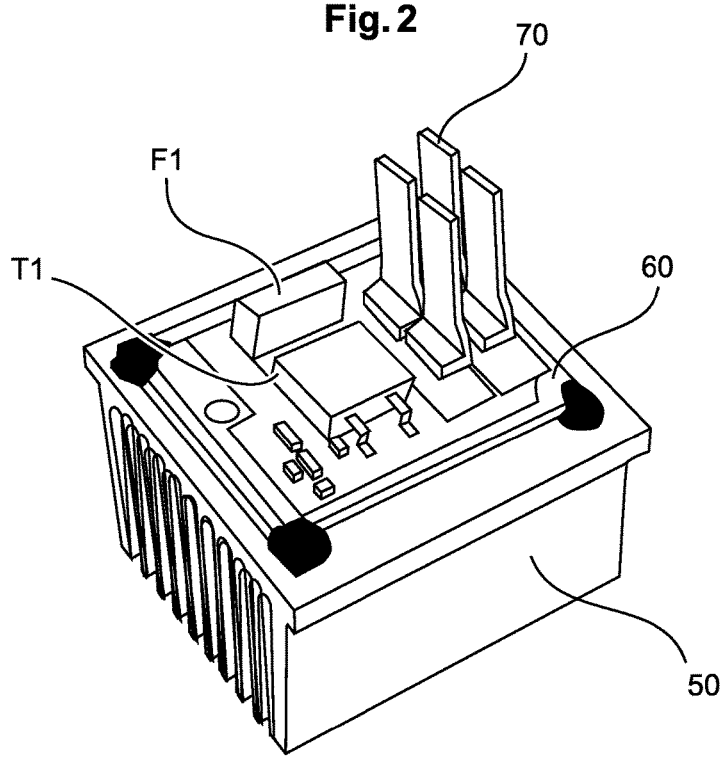
FIG. 3 shows a perspective view of an equipped circuit board provided with a cooling body according to a third embodiment of the present invention.

FIG. 3 shows a diagrammatic view of a circuit board 60 with cooling body 50 fixed thereto in accordance with a third embodiment of the present invention.

The circuit board 60 is connected directly to the cooling body 50 to ensure thereby good dissipation of the heat formed in the MOSFET transistor T1 as shown in FIG. 2. FIG. 3 also shows the MOSFET transistor T1, the melting fuse F1 and the outwardly extending terminals 70 for ground (G), control voltage (I) for controlling the motor speed, motor (M) and feedback (F).

It is thus possible to achieve a compact structure for the circuit arrangement with good heat dissipation and improved thermal protection.

Figure 4:
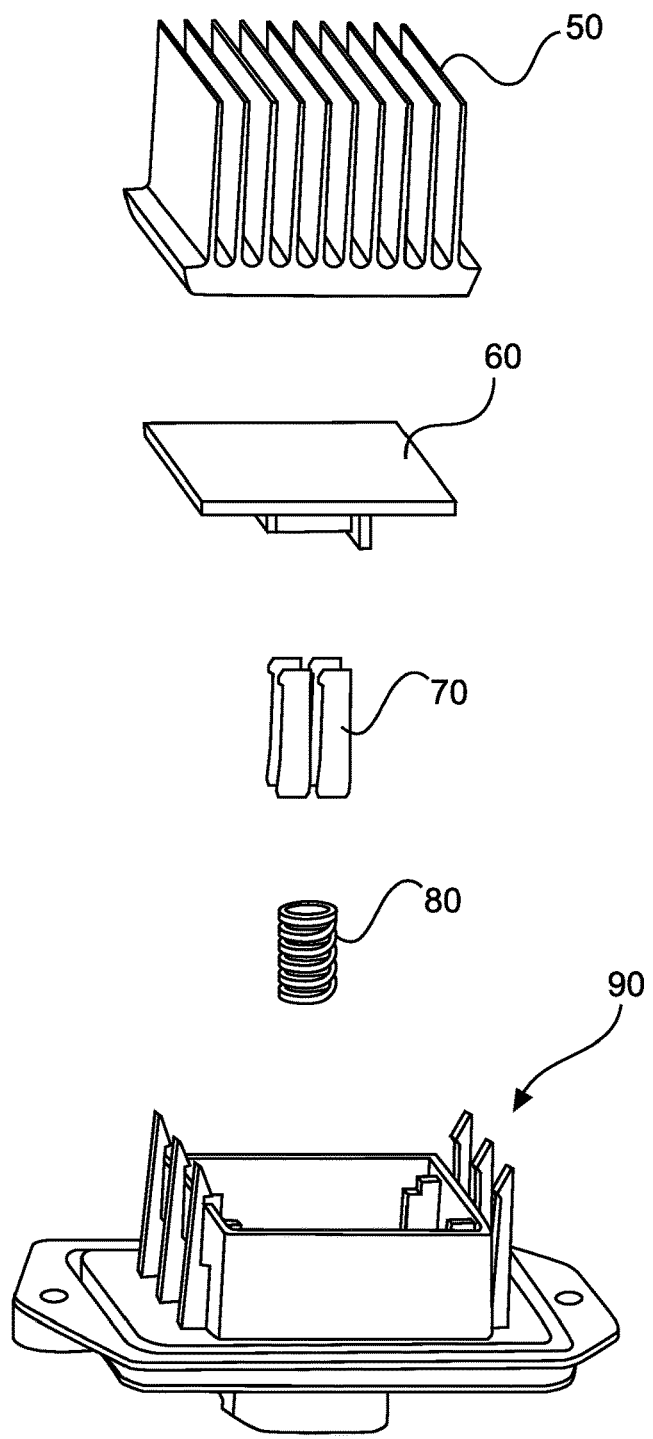
FIG. 4 shows a dismantled exploded view of a circuit arrangement with closed housing according to a fourth embodiment.

FIG. 4 shows an exploded view of a circuit arrangement disposed in a closed housing in accordance with a fourth embodiment.

In this case the cooling body 50, the circuit board 60 and the terminals 70 correspond to the corresponding components in the third embodiment of FIG. 3.

The view in FIG. 4 shows the individual components and the successive arrangement thereof in the assembled condition. In addition to the components shown in FIG. 3 there is also a coil spring 80 for pressing the circuit board 60 with the MOSFET transistor T1 in relation to the cooling body 50 forming a heat sink.

Finally the circuit arrangement of the fourth embodiment also includes a housing element 60 with a fixing which can be released in latch-like fashion and into which the two side edges of the cooling body 50 releasably latch after assembly so that the circuit board 60, the terminals 70 and the spring 80 are enclosed by the housing formed by the cooling body 50 and the housing element 90. That makes it possible to provide a circuit arrangement which is protected in relation to environmental influences, with improved thermal protection and good heat dissipation. For electrical connection of the circuit arrangement the terminals 70 are passed out through one or more suitable openings at the underside of the housing element 90.

The cooling body 50 can involve a linearly extruded structure which can also be modified by hand. The circuit board 60 can be fixed by means of silicone drops, adhesive or the like, in which case it is necessary to ensure good heat transfer. In that respect it is also possible to use a thermally conducting paste. The circuit board 60 can be equipped by machine or manually, in which case for example a reflow soldering operation can be performed using surface-mounted devices (SMD). The terminals 70 can be in the form of SMD terminals.

The coil spring can be manufactured in mass production and provided with a heat-conducting fixing. The upwardly projecting latching hooks of the housing element 90 can be fixed with silicone and the housing element 90 can be an injection molding wherein the latching hooks of the latching mechanism can alternatively also be provided directly in the casting mold.

Figure 5A:
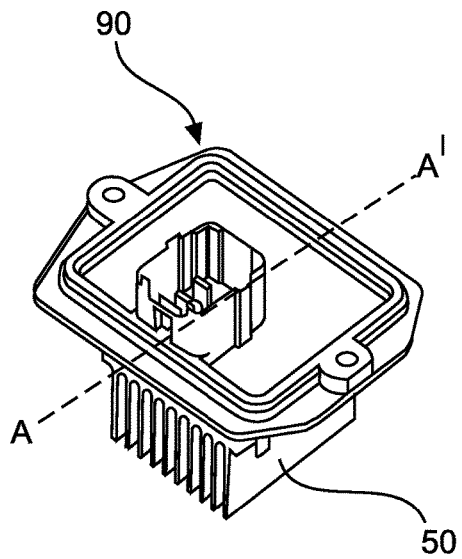
FIGS. 5A and 5B show perspective views of the circuit arrangement according to the fourth embodiment.
Figure 5B:
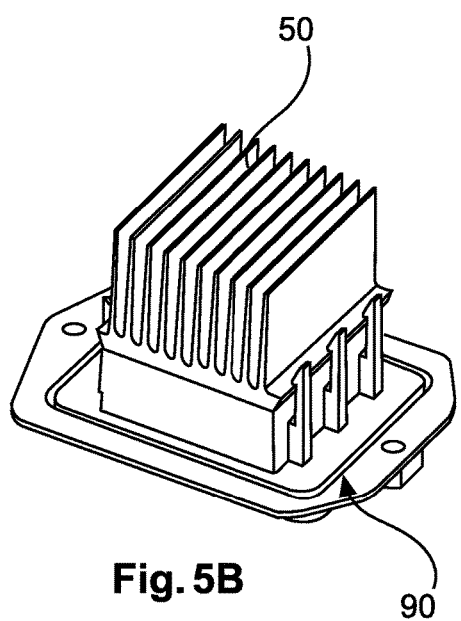

FIGS. 5A and 5B show perspective views of the assembled circuit arrangement in accordance with the fourth embodiment shown in FIG. 4 in a view inclinedly from above and inclinedly from below. The views show the cooling body 50 which is latchingly engaged into the housing element 90, wherein an opening provided in the underside of the housing element 90 for access to the terminals 70 can be seen in FIG. 5A.

Figure 6:
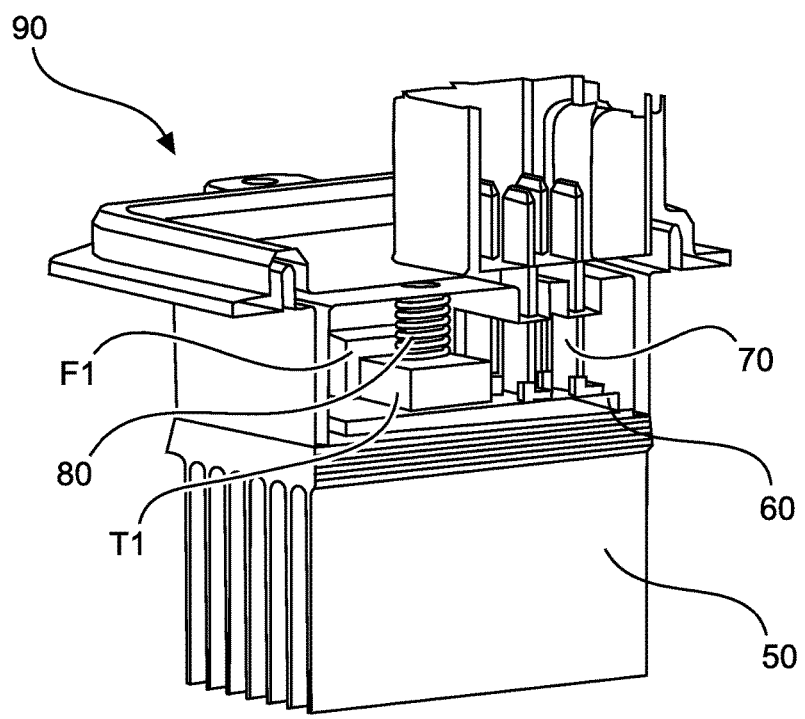
FIG. 6 shows a perspective sectional view of the circuit arrangement with closed housing according to the fourth embodiment.

Finally FIG. 6 shows a sectional view through the assembled circuit arrangement of FIG. 5A in section along line A-A'.

The sectional view in FIG. 6 shows the assembled condition of the individual components shown in FIG. 4, wherein the circuit board with the MOSFET transistor T1 and the melting fuse F1 is pressed against the cooling body 50 by means of the coil spring 80 in order thereby to achieve a good thermal coupling effect. The melting fuse F1 preferably also has a good thermal coupling to the MOSFET transistor T1 so that overheating of the MOSFET transistor T1 can be reliably avoided. In addition FIG. 6 shows the terminals 70 which are fixed or soldered on the circuit board 60 and the way in which they extend out of the housing element 90.

The encapsulated structure in accordance with the fourth embodiment is thus well protected in relation to environmental influences in harsh areas of use like for example in the field of motor vehicles.

Finally it is noted that the present invention is not limited to the above-described embodiments but can be modified in accordance with the scope of the accompanying claims. As already mentioned the electrical components of the circuit board can be SMD components which can be applied in automated fashion. The MOSFET transistor can be a high-power MOSFET suitable for use in the vehicle field, with a suitable housing like for example $D^2PAK$ or the like. It will be appreciated that other power semiconductors and also combinations of FET transistors and bipolar transistors are also conceivable as power semiconductors. The thermal cutout device can be an SMD cutout device for surface mounting using the reflow process. The thermal resistor can be a PTC or NTC resistor, a semiconductor component or an SMD chip for reversible gate disconnect of the power semiconductor. The circuit board can be an IMS (insulated metal substrate) with optimized material configuration for improving the thermal behaviour so that optimized temperature coupling can be achieved. A good heat transfer can be achieved between the circuit board and the cooling body by thermally conducting paste, bonding or thermal contact points or contact regions. The power semiconductor (for example MOSFET transistor T1) can be fixed on the circuit board by means of a spring mechanism in order thereby to achieve good heat conduction between the power semiconductor and the circuit board or the cooling body. The coil spring can be replaced by any other alternative spring or pressure-applying mechanism. The cooling ribs of the cooling body can be of a shape optimized for cooling purposes.

To sum up a circuit arrangement for thermal protection of a power semiconductor is described, wherein there is provided a two-stage thermal protection in the control circuit and in the load circuit of the power semiconductor. A first stage 10 with temperature-dependent resistance device serves for reducing or switching off the control voltage of the power semiconductor 30 when a first threshold temperature is reached at the temperature-dependent resistance device. In addition provided in the load circuit of the power semiconductor 30 is a second stage 20 with a cutout element thermally coupled to the power semiconductor 30 for interrupting a load current of the power semiconductor when a second threshold temperature is reached at the cutout element. In that case the first stage forms an active temperature protection for the power semiconductor 30 to avoid damage and the second stage forms a temperature protection in the case of a malfunction of the power semiconductor 30.

What is claimed is:

1. A circuit arrangement for the thermal protection of a power semiconductor associated with an electric motor, comprising:
   a first stage provided in a control circuit of the power semiconductor and with a temperature-dependent resistance device for reversibly reducing or switching off a control voltage of the power semiconductor when a first threshold temperature associated with the temperature of the power semiconductor is reached at the temperature-dependent resistance device; and
   a second stage provided in a load circuit of the power semiconductor and with a cutout element thermally coupled to the power semiconductor for permanently interrupting a load current of the power semiconductor when a second threshold temperature, higher than the first threshold temperature, is reached at the cutout element.

2. The circuit arrangement as set forth in claim 1, wherein the circuit arrangement has a circuit board adapted to be received in a closed housing with integrated cooling body and passed-out connecting contacts.

3. The circuit arrangement as set forth in claim 2, comprising a pressure application device for pressing the power semiconductor and the circuit board against the cooling body.

4. The circuit arrangement as set forth in claim 3 wherein the cooling body is connected to the housing by way of a releasable latch connection.

5. The circuit arrangement as set forth in claim 4, wherein the temperature-dependent resistance device is arranged in a voltage divider branch of the first stage.

6. The circuit arrangement as set forth in claim 5, wherein the temperature-dependent resistance device has a resistor with a positive temperature coefficient.

7. The circuit arrangement as set forth in claim 6, wherein the temperature-dependent resistance device is provided within the first stage in the form of a semiconductor component or a semiconductor circuit with corresponding characteristic.

8. The circuit arrangement as set forth in claim 7, wherein the thermal cutout element has at least one melting fuse.

9. The circuit arrangement as set forth in claim 8, wherein the power semiconductor has a field effect transistor for controlling the electric motor.

10. The circuit arrangement as set forth in claim 2, wherein the cooling body is connected to the housing by way of a releasable latch connection.

11. The circuit arrangement as set forth in claim 1, wherein the temperature-dependent resistance device is arranged in a voltage divider branch of the first stage.

12. The circuit arrangement as set forth in claim 1, wherein the temperature-dependent resistance device has a resistor with a positive temperature coefficient.

13. The circuit arrangement as set forth in claim 1, wherein the temperature-dependent resistance device is provided within the first stage in the form of a semiconductor component or a semiconductor circuit with corresponding characteristic.

14. The circuit arrangement as set forth in claim 1, wherein the thermal cutout element has at least one melting fuse.

15. The circuit arrangement as set forth in claim 1, wherein the power semiconductor has a field effect transistor for controlling the electric motor.

* * * * *